US009653011B2

(12) United States Patent
Kang

(10) Patent No.: US 9,653,011 B2
(45) Date of Patent: May 16, 2017

(54) PRINTED CIRCUIT BOARD ASSEMBLY AND DISPLAY DEVICE HAVING THE SAME

(71) Applicant: Samsung Display Co., Ltd., Yongin, Gyeonggi-do (KR)

(72) Inventor: Moonshik Kang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 132 days.

(21) Appl. No.: 14/167,086

(22) Filed: Jan. 29, 2014

(65) Prior Publication Data

US 2015/0054515 A1 Feb. 26, 2015

(30) Foreign Application Priority Data

Aug. 23, 2013 (KR) ........................ 10-2013-0100613

(51) Int. Cl.

*G01R 31/44* (2006.01)
*G09G 3/00* (2006.01)
*G09G 3/34* (2006.01)

(52) U.S. Cl.

CPC ........... *G09G 3/006* (2013.01); *G09G 3/3406* (2013.01)

(58) Field of Classification Search

CPC ............ F21V 19/00; G09G 3/00; G01R 31/44
USPC ................. 324/537, 756.07, 757.02, 763.01; 361/719, 720, 736, 748, 761
See application file for complete search history.

(56) References Cited

U.S. PATENT DOCUMENTS 3,568,136 A * 3/1971 Wells ..................... H01R 31/00 324/754.11
3,945,711 A 3/1976 Hohorst et al.
4,714,875 A * 12/1987 Bailey ................ G01R 31/2637 324/537
4,769,596 A * 9/1988 Faucett ............. G01R 31/2805 324/537
7,432,450 B2 * 10/2008 Kim ....................... H05K 1/114 174/255
7,887,210 B2 * 2/2011 Kim ............................ 362/97.3
7,932,969 B2 * 4/2011 Hong .................. G02B 6/0085 349/150
2003/0207622 A1 * 11/2003 Gutierrez ............ H01R 13/717 439/676
2005/0083074 A1 4/2005 Chou et al.
2008/0023830 A1 1/2008 Chang et al.
2008/0121421 A1 * 5/2008 Kashiwakura ....... H05K 1/0251 174/262

(Continued)

FOREIGN PATENT DOCUMENTS

KR 10-2000-0061174 10/2000
KR 10-2001-0077358 8/2001

(Continued)

*Primary Examiner* — Son Le
*Assistant Examiner* — Alvaro Fortich
(74) *Attorney, Agent, or Firm* — Knobbe Martens Olson & Bear LLP

(57) ABSTRACT

A printed circuit board assembly includes a printed circuit board, a connector mounted on the printed circuit board and including at least one terminal electrically connected to an external device, and at least one electronic component mounted on the printed circuit board and electrically connected to the at least one terminal of the connector. The connector includes at least one test point electrically connected to the terminal and configured to make contact with a test probe.

15 Claims, 9 Drawing Sheets

(56) References Cited

U.S. PATENT DOCUMENTS

| | | | | |
|---|---|---|---|---|
| 2008/0171451 | A1* | 7/2008 | Shin | H01R 12/732 439/65 |
| 2010/0081309 | A1* | 4/2010 | Voli | H01R 12/7047 439/275 |
| 2010/0165237 | A1* | 7/2010 | Jung | 349/58 |
| 2011/0111609 | A1* | 5/2011 | Goto | H01R 12/585 439/83 |
| 2011/0230044 | A1 | 9/2011 | Chang et al. | |
| 2012/0050648 | A1* | 3/2012 | Jang et al. | 349/65 |
| 2012/0250290 | A1* | 10/2012 | Park et al. | 362/97.1 |

FOREIGN PATENT DOCUMENTS

| | | | |
|---|---|---|---|
| KR | 20-0293353 | 10/2002 | |
| KR | 10-2003-0018265 | 3/2003 | |
| KR | 10-2006-0133251 | 12/2006 | |
| KR | 10-2007-0067818 | 6/2007 | |
| KR | 10-2007-0067818 | * 10/2007 | G01R 1/073 |
| KR | 10-2008-0001234 | 1/2008 | |
| KR | 10-2008-0076383 | 8/2008 | |
| KR | 10-2009-0119634 | 11/2009 | |
| KR | 10-2010-0019273 | 2/2010 | |
| KR | 10-2010-0064498 | 6/2010 | |
| KR | 10-2010-0108939 | 10/2010 | |
| KR | 10-2012-0032078 | 4/2012 | |

* cited by examiner

PRINTED CIRCUIT BOARD ASSEMBLY AND DISPLAY DEVICE HAVING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority under 35 U.S.C. §119 of Korean Patent Application No. 10-2013-0100613, filed on Aug. 23, 2013, the contents of which are hereby incorporated by reference in their entirety.

BACKGROUND

Field

The present disclosure relates to a printed circuit board assembly and a display device having the same.

Description of the Related Technology

A non self-emissive display device, such as a liquid crystal display device, typically requires a backlight unit that provides light to a display panel since the display panel is not self-emissive. In general, the backlight unit includes a cold cathode fluorescent lamp as its light source.

In recent years, however, a light emitting diode is used as the light source of the backlight unit instead of the cold cathode fluorescent lamp to reduce power consumption and to improve color reproducibility. The backlight unit employing the light emitting diode as the light source includes a plurality of light source blocks that emit the light.

The backlight unit including the light emitting diode is classified into an edge-illumination type and a direct-illumination type in accordance with the position of the light source blocks. Nowadays, the edge-illumination type backlight unit is widely used in accordance with the trend of compactness and slimness in the display device.

SUMMARY OF CERTAIN INVENTIVE ASPECTS

The present disclosure provides a printed circuit board assembly including a connector with a test point.

The present disclosure provides a display device having the printed circuit board assembly.

Embodiments of the inventive concept provide a printed circuit board assembly including a printed circuit board, a connector mounted on the printed circuit board and including at least one terminal electrically connected to an external device, and at least one electronic component mounted on the printed circuit board and electrically connected to the at least one terminal of the connector. The connector includes at least one test point electrically connected to the at least one terminal and configured to make contact with a test probe.

The at least one terminal is disposed on an upper surface of the printed circuit board such that at least a portion of a surface of the at least one terminal is exposed.

The at least one test point is disposed on the at least a portion of the surface of the at least one terminal.

The at least one test point includes a recess into which the test probe is inserted.

The connector may include a plurality of terminals and the plurality of terminals may be arranged to be spaced apart from each other by a predetermined distance.

The connector may include a plurality of test points and the plurality of test points may be respectively and electrically connected to the terminals and configured to make contact with the test probe.

The connector further includes a contact portion connected to one end of the at least one terminal, and the at least one test point is disposed on an upper portion of the contact portion.

The at least one test point includes a recess into which the test probe is inserted.

The connector includes a slot into which a contact pad of the external device is inserted.

The contact pad is electrically connected to the at least one terminal when the contact pad of the external device is inserted into the slot.

The test point is a hole formed through an upper portion of the connector to correspond to the terminal.

The electronic component includes a light emitting diode package.

Embodiments of the inventive concept provide a display device including a display panel, a driving circuit that generates driving signals to drive the display panel, and a backlight assembly that provides a light to the display panel. The backlight assembly includes a printed circuit board, a connector that includes at least one terminal mounted on the printed circuit board and electrically connected to the driving circuit, and at least one light emitting diode package mounted on the printed circuit board and electrically connected to the at least one terminal of the connector. The connector includes at least one test point electrically connected to the at least one terminal and configured to make contact with a test probe.

The at least one terminal is disposed on an upper surface of the printed circuit board such that at least a portion of a surface of the at least one terminal is exposed.

The at least one test point is disposed on the at least a portion of the surface of the at least one terminal.

The at least one test point includes a recess into which the test probe is inserted.

The connector further includes a contact portion connected to one end of the at least one terminal, and the test point is disposed on an upper portion of the contact portion to make contact with the test probe.

The at least one test point includes a recess into which the test probe is inserted.

The connector includes a slot into which a contact pad of the driving circuit is inserted.

The contact pad is electrically connected to the at least one terminal when the contact pad of the driving circuit is inserted into the slot.

According to the above, the connector includes the at least one test point, and thus the printed circuit board does not need to include a separate test terminal. As a result, the size of the printed circuit board may be minimized and the display device becomes compact and slim.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF CERTAIN INVENTIVE EMBODIMENTS

Hereinafter, the present invention will be explained in detail with reference to the accompanying drawings.

The light source blocks of a backlight unit are typically mounted on a printed circuit board connected to a driving circuit through a connector. In recent years, however, with printed circuit boards becoming smaller in size, it is difficult to secure a space for a test terminal used to test the light source blocks.

Figure 1:
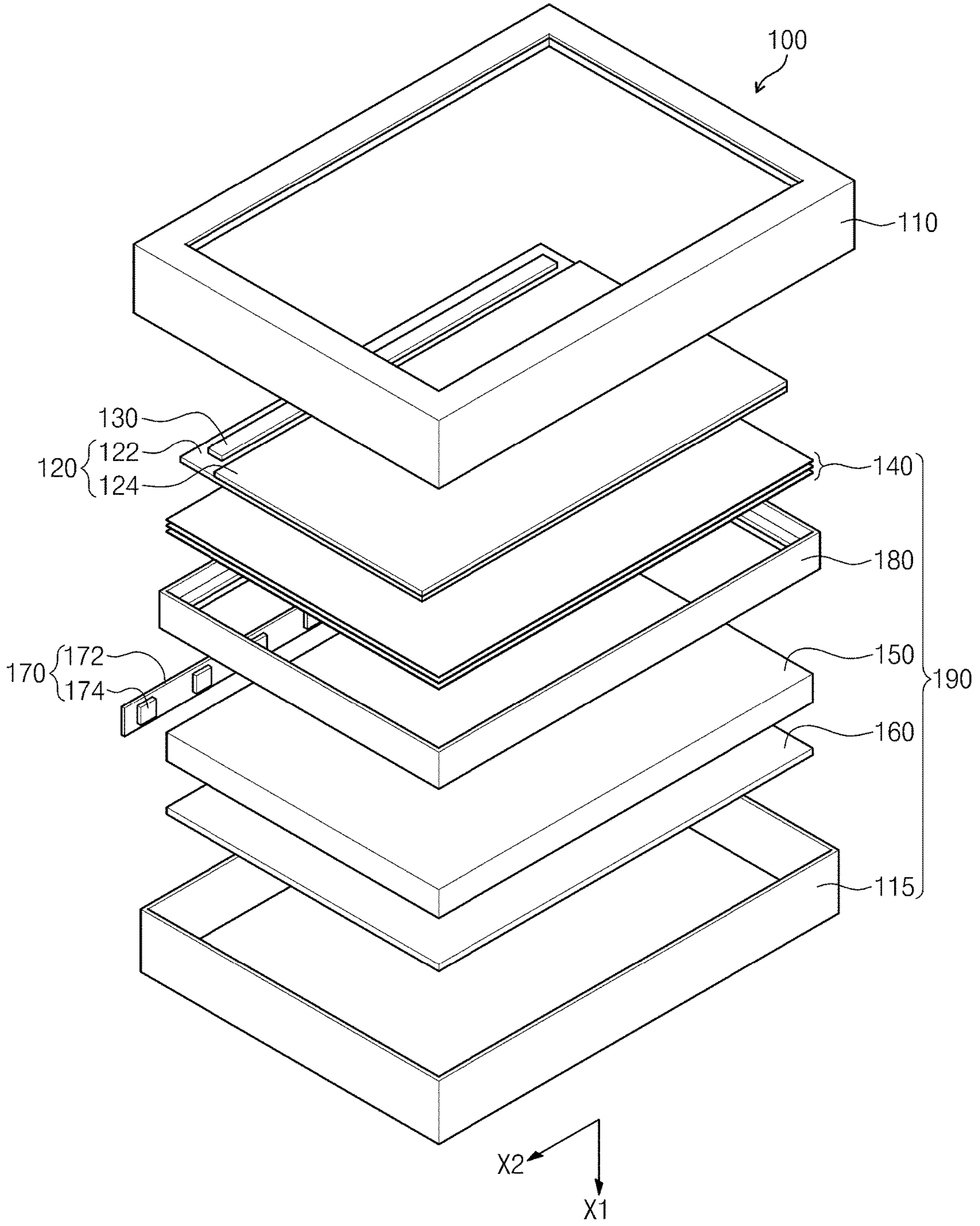
FIG. 1 is an exploded perspective view showing a display device according to an embodiment of the present disclosure.

FIG. 1 is an exploded perspective view showing a display device according to an embodiment of the present disclosure.

Referring to FIG. 1, a display device 100 includes an upper receiving container 110, a display panel 120, and a backlight assembly 190. The backlight assembly 190 includes an optical sheet 140, a mold frame 180, a light guide plate 150, a backlight unit 170, a reflective sheet 160, and a lower receiving container 115.

The display panel 120 includes a lower display substrate 122 and an upper display substrate 124 disposed to face the lower display substrate 122. The lower display substrate 122 includes gate lines, data lines, thin film transistors, and pixel electrodes, and the upper display substrate 124 includes a black matrix and a common electrode. According to another embodiment, the black matrix and the common electrode may be disposed on the lower display substrate 122. The display panel 120 receives light from the backlight unit 170 to display image information. In addition, polarizing films (not shown) may be respectively disposed on upper and lower surfaces of the display panel 120. Here, the upper display substrate 124 has a size smaller than that of the lower display substrate 122. Further, a driving circuit 130 is configured to include a plurality of integrated circuit chips and mounted on an edge of the lower display substrate 122, and the driving circuit 130 is not overlapped with the upper display substrate 124.

When the thin film transistor is turned on, an electric field is formed between the pixel electrode and the common electrode. Due to the electric field, an arrangement of liquid crystal molecules in a liquid crystal layer (not shown) disposed between the upper display substrate 124 and the lower display substrate 122 is changed, and thus a transmittance of the light passing through the display panel 120 is changed in each pixel. As described above, the display panel 120 controls the transmittance of the light provided from the backlight unit 170 to display desired images.

The upper receiving container 110 determines an outer shape of the display device 100 and provides a space therein to accommodate the display panel 120. The upper receiving container 110 is provided with a window formed therethrough to expose the display panel 120. The upper receiving container 110 may be coupled to the lower receiving container 115.

The mold frame 180 is disposed between the upper receiving container 110 and the lower receiving container 115 to accommodate the display panel 120 and the optical sheet 140. The optical sheet 140 diffuses and condenses the light from the light guide plate 150 and is disposed on the light guide plate 150 to be accommodated in the upper and lower receiving containers 110 and 115. The optical sheet 140 includes a first prism sheet, a second prism sheet, and a protective sheet. The first and second prism sheets refract the light from the light guide plate 150 to condense the light in a front direction, thereby improving brightness of the display device in an effective viewing angle range. The protective sheet disposed on the first and second prism sheets protects surfaces of the prism sheets and diffuses the light to allow a distribution of the light to be uniform. The configuration of the optical sheet 140 is not limited to the above-mentioned configuration.

The light guide plate 150 is accommodated in the lower receiving container 115 and disposed adjacent to a plurality of the light source blocks 174 to guide the light provided from the light source blocks 174. The light guide plate 150 diffuses the light provided from the light source blocks 174 to various directions and prevents bright lines caused by the positions of the light source blocks 174 from being perceived by a user. The light guide plate 150 includes a light incident portion to which the light emitted from the light source blocks 174 is incident and an opposite portion opposite to the light incident portion.

The reflective sheet 160 is disposed under the light guide plate 150 and reflects the light leaked downward from the light guide plate 150 such that the reflected light travels upward. The reflective sheet 160 may reduce loss of the light and improves uniformity of the light incident to the display panel 120. The reflective sheet 160 may be provided as a separate sheet form or may be a reflective pattern formed by coating a material having high reflectance on the lower receiving container 115.

The backlight unit 170 is disposed in the lower receiving container 115 and includes a printed circuit board 172 and the light source blocks 174 mounted on the printed circuit board 172. The light source blocks 174 may be configured to include point light sources, such as, for example, a light emitting diode. The light source blocks 174 are arranged in a second direction X2 and spaced apart from each other. The light source blocks 174 are arranged along one direction and the light source blocks 174 are not necessarily aligned in a straight line. In addition, the light source blocks 174 are not limited to the point light source. A line light source may also be used as the light source blocks. The printed circuit board 172 on which the light source blocks 174 are mounted may be disposed in the lower receiving container 115. The number of the light source blocks 174 are not limited to any specific number. In FIG. 1, the backlight unit 170 is disposed adjacent to one long side of the light guide plate 150, but it should not be limited thereto or thereby. Two backlight units may be disposed adjacent to two long sides of the light guide plate 150 and extended in the second direction X2. In addition, according to another embodiment, the backlight unit 170 may be disposed adjacent to one short side or two short sides of the light guide plate 150.

Figure 2:
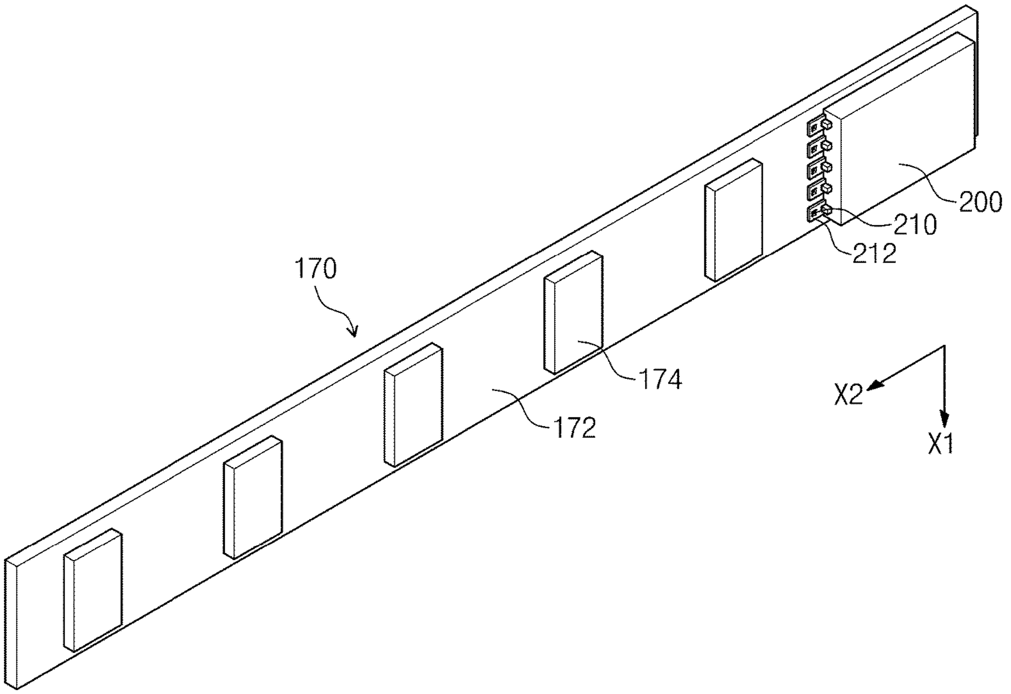
FIG. 2 is a perspective view showing a backlight unit shown in FIG. 1.
Figure 3:
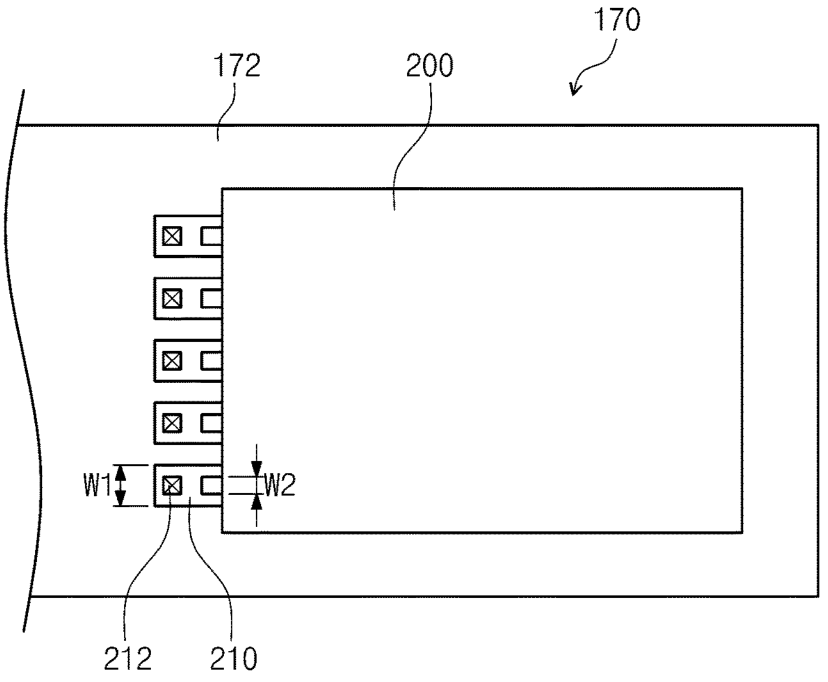
FIG. 3 is a plan view showing the backlight unit shown in FIG. 2.
Figure 4:
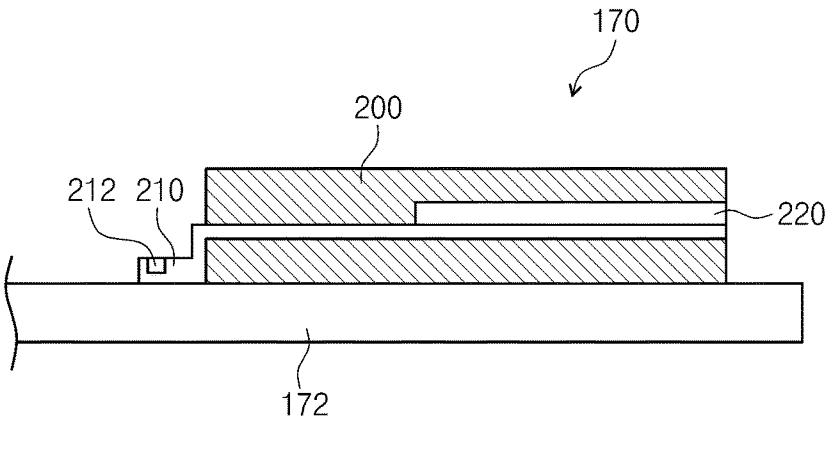
FIG. 4 is a cross-sectional view showing the backlight unit shown in FIG. 2.
Figure 5:
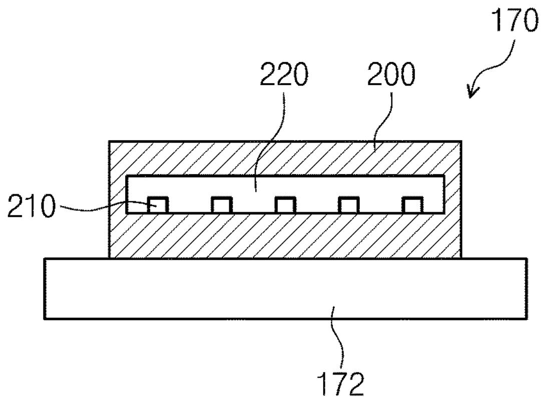
FIG. 5 is a side view showing the backlight unit shown in FIG. 2 when viewed in a second direction.

FIG. 2 is a perspective view showing the backlight unit shown in FIG. 1, FIG. 3 is a plan view showing the backlight unit shown in FIG. 2, FIG. 4 is a cross-sectional view showing the backlight unit shown in FIG. 2, and FIG. 5 is a side view showing the backlight unit shown in FIG. 2 when viewed in a second direction.

Referring to FIGS. 2 to 5, the backlight unit 170 includes the printed circuit board 172, the light source blocks 174 mounted on the surface of the printed circuit board 172, and a connector 200 disposed on the surface of the printed circuit board 172. The backlight unit 170 may be referred to herein as a printed circuit board assembly.

Each of the light source blocks 174 includes at least one light emitting diode (LED) package (not shown).

The connector 200 includes terminals 210 arranged on one surface thereof. The terminals 210 respectively correspond to the light source blocks 174. Each of the terminals 210 is electrically connected to a corresponding light source block of the light source blocks 174. Signal lines may be disposed on the surface of the printed circuit board 172 to electrically connect the terminals 210 and the light source blocks 174.

The connector 200 may be electrically connected to the driving circuit 130 shown in FIG. 1 through a cable (not shown). The connector 200 includes a slot 220 into which a contact pad (not shown) of the cable is inserted. Accordingly, when the contact pad of the cable is inserted into the slot 220, the contact pad of the cable may be electrically connected to the terminals 210. Therefore, the light source blocks 174 may be controlled by a control signal provided from the driving circuit 130 through the connector 200.

The terminals 210 are disposed on the surface of the printed circuit board 172 to be partially exposed. Each of the terminals 210 includes a test point 212 that makes contact with a test probe. The test point 212 is disposed on a portion of an upper surface of each terminal 210 and includes a recess into which the test probe is inserted.

A width W1 of a portion of each of the terminals 210, which makes contact with the printed circuit board 172, is wider than a width W2 of a portion of each of the terminals 210, which makes contact with the connector 200. Thus, the test point 212 may secure an area enough to make contact with the test probe.

Figure 6:
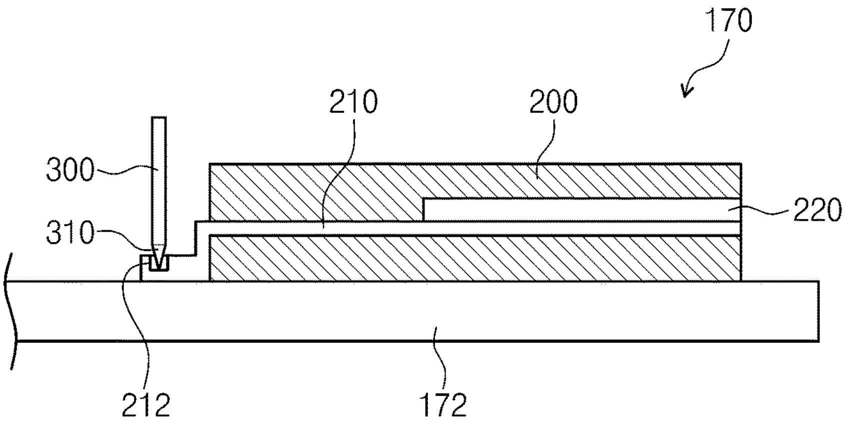
FIG. 6 is a view showing a test probe making contact with a test point of the backlight unit shown in FIG. 2.

FIG. 6 is a view showing the test probe making contact with the test point of the backlight unit shown in FIG. 2.

Referring to FIG. 6, a test process is performed as a last process of the manufacturing process of the backlight unit 170 to check whether the backlight unit 170 is normally driven or not. The light source blocks 174 included in the backlight unit 170 may be tested by inserting a probe 310 of the test probe 300 into the test point 212 of each of the terminals 210.

In recent years, since the printed circuit board 172 becomes smaller in size, it is difficult to form the test point 212 in the signal lines disposed on the printed circuit board 172. As described above, in one embodiment, the size of the printed circuit board 172 may be minimized since the test point 212 is disposed on the terminals 210 of the connector 200.

Figure 7:
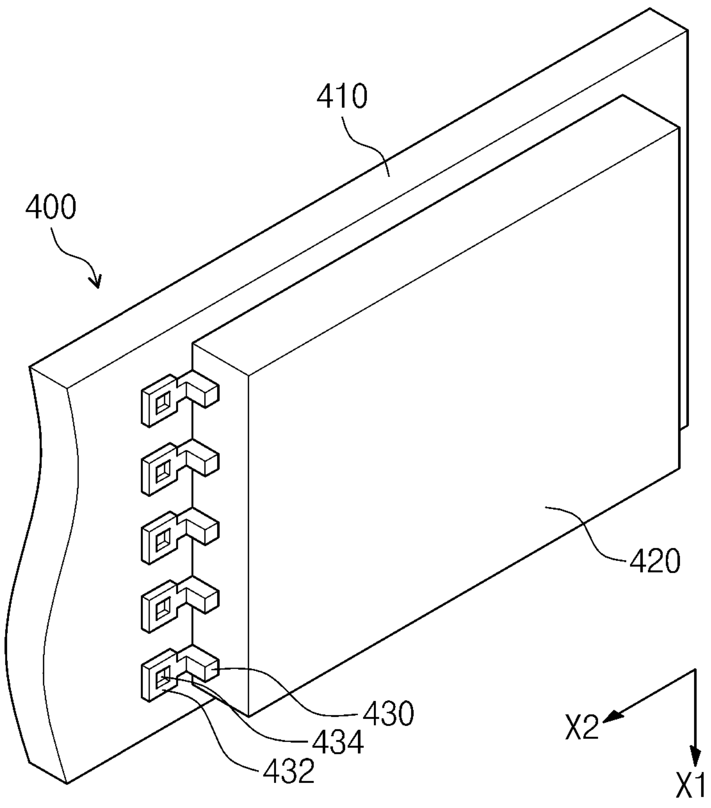
FIG. 7 is a perspective view showing a portion of a backlight unit according to another embodiment of the present disclosure.
Figure 8:
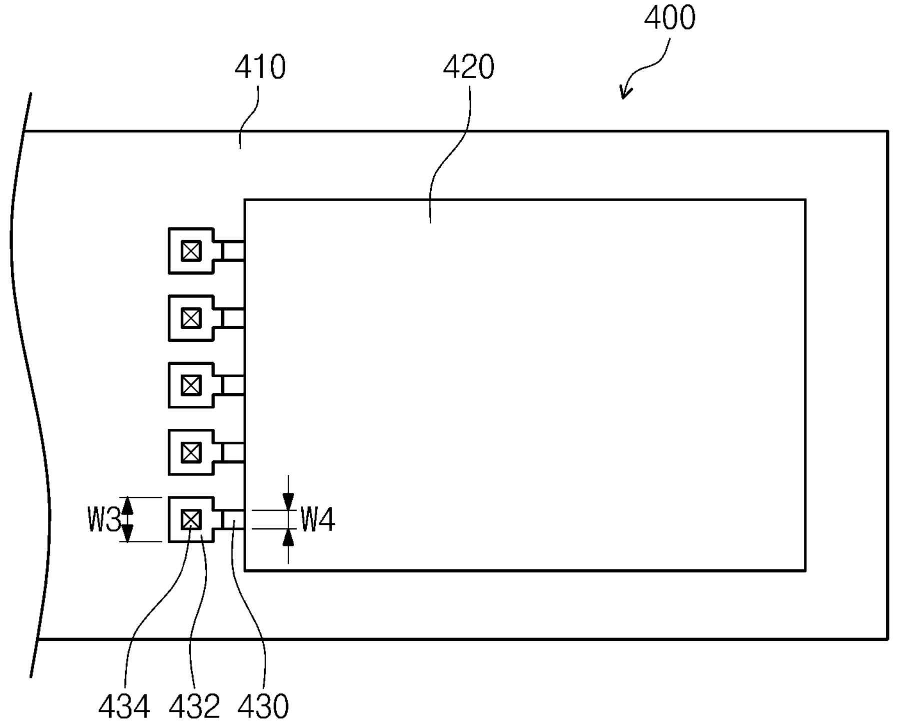
FIG. 8 is a plan view showing the backlight unit shown in FIG. 7.

FIG. 7 is a perspective view showing a portion of a backlight unit according to another embodiment of the present disclosure and FIG. 8 is a plan view showing the backlight unit shown in FIG. 7.

Referring to FIGS. 7 and 8, a backlight unit 400 includes a connector 420 mounted on a surface of a printed circuit board 410. The connector 420 includes a plurality of terminals 430 arranged on one surface thereof. Each of the terminals 430 may be electrically connected to a corresponding light source of the light sources. The connector 420 may be electrically connected to the driving circuit 130 shown in FIG. 1 through a cable (not shown).

The terminals 430 are disposed on the printed circuit board 410 to be partially exposed. Each of the terminals 430 includes a contact portion 432 formed at one end portion thereof. Each of the contact portions 432 has a width W3 wider than a width W4 of the terminals 430. Each of the contact portions 432 includes a test point 434 formed therein, which makes contact with the test probe. As described above, since the test point 434 is formed on the contact portions 432 each having the width W3 wider than the width W4 of the terminals 430, the test point 434 may secure an area enough to make contact with the test probe.

Figure 9:
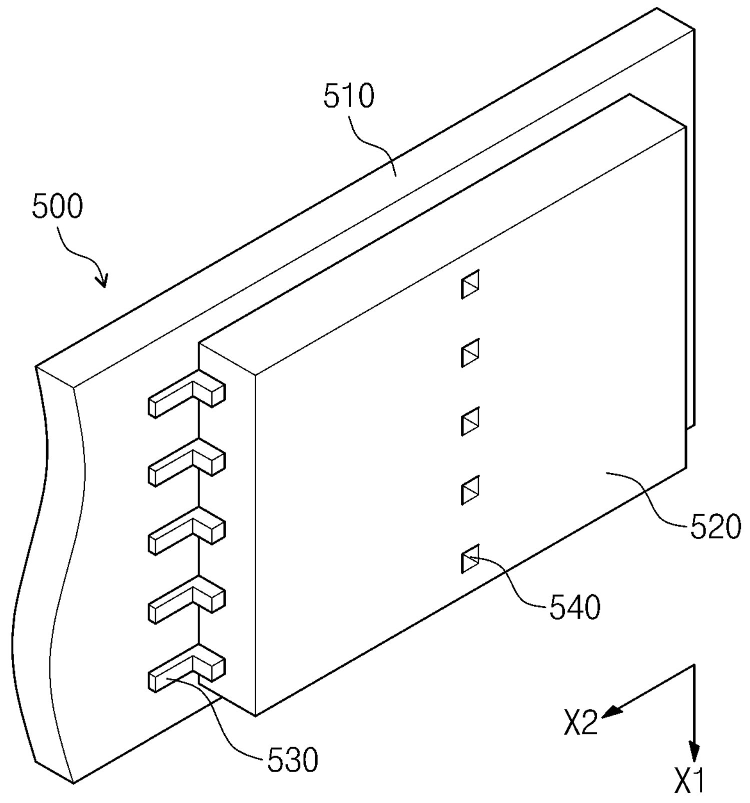
FIG. 9 is a perspective view showing a portion of a backlight unit according to another embodiment of the present disclosure.
Figure 10:
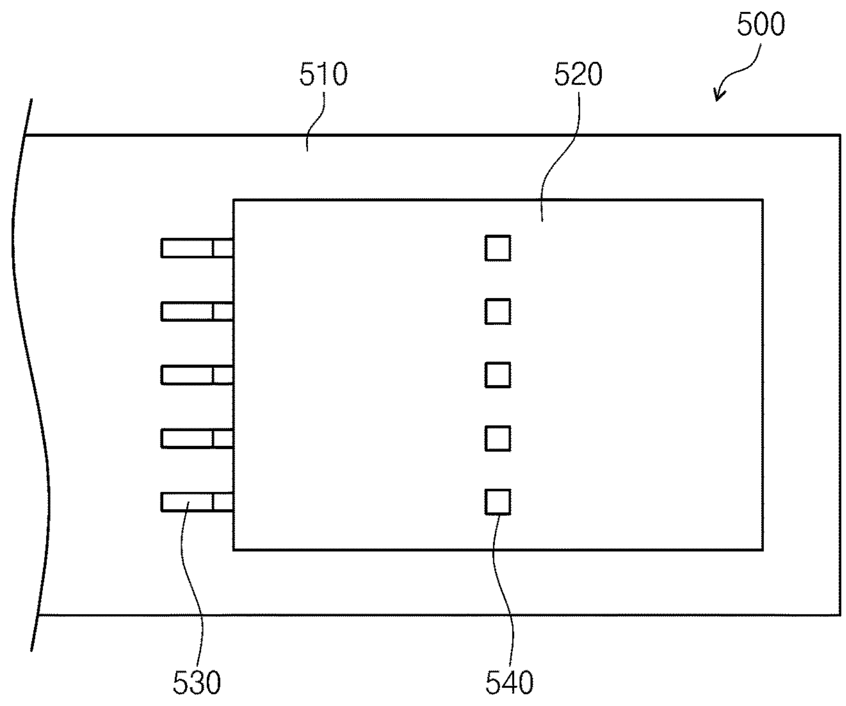
FIG. 10 is a plan view showing the backlight unit shown in FIG. 9.
Figure 11:
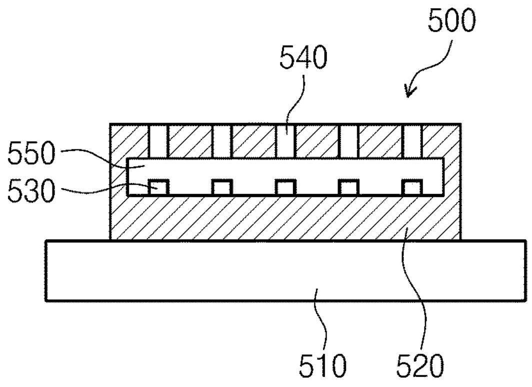
FIG. 11 is a side view showing the backlight unit shown in FIG. 9 when viewed in a second direction.

FIG. 9 is a perspective view showing a portion of a backlight unit according to another embodiment of the present disclosure, FIG. 10 is a plan view showing the backlight unit shown in FIG. 9, and FIG. 11 is a side view showing the backlight unit shown in FIG. 9 when viewed in a second direction.

Referring to FIGS. 9 to 11, a backlight unit 500 includes a connector 520 mounted on a surface of a printed circuit board 510. The connector 520 includes a plurality of terminals 530 arranged on one surface thereof. Each of the terminals 530 may be electrically connected to a corresponding light source of the light sources. The connector 520 may be electrically connected to the driving circuit 130 shown in FIG. 1 through a cable (not shown).

The connector 520 includes a slot 550 into which a contact pad (not shown) of the cable is inserted. The terminals 530 are disposed on a lower portion of the slot 550. Therefore, when the contact pad of the cable is inserted into the slot 550, the contact pad of the cable may be electrically connected to the terminals 530. The terminals 530 are disposed on the surface of the printed circuit board 510 to be partially exposed.

A plurality of test point holes 540 is formed through an upper portion of the connector 520 to respectively correspond to the terminals 530. The test probe makes contact with the terminals 530 after passing through the test point holes 540 formed through the connector 520.

Figure 12:
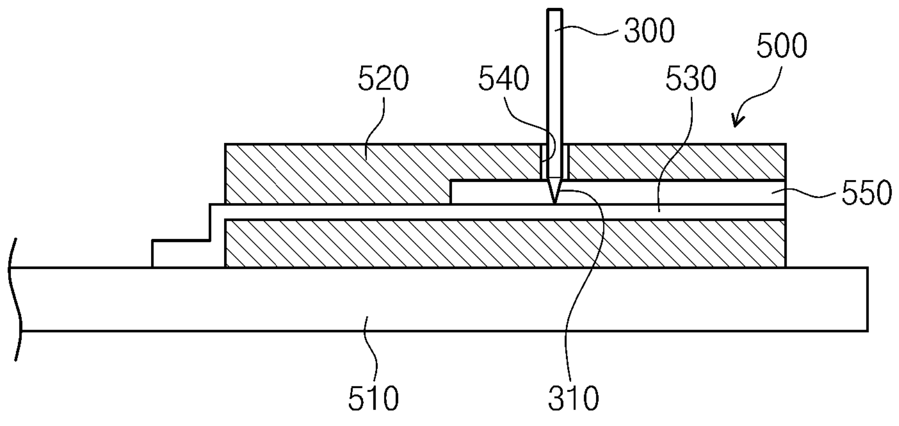
FIG. 12 is a view showing a test probe making contact with a test point of the backlight unit shown in FIG. 9.

FIG. 12 is a view showing a test probe making contact with a test point of the backlight unit shown in FIG. 9.

Referring to FIG. 12, a test process is performed as a last process of the manufacturing process of the backlight unit 500 to check whether the backlight unit 500 is normally driven or not. When the probe 310 of the test probe 300 is inserted into the test point hole 540 in order to test the backlight unit 500, the probe 310 makes contact with the terminal 530. The test point hole 540 has a size such that not only the probe 310 of the test probe 300 but also a portion of the test probe 300 is inserted into the test point hole 540.

As described above, when the test point holes 540 are formed through the upper portion of the connector 520, a separate test point is not needed to be formed on the printed circuit board 510. Thus, the printed circuit board 510 may be minimized in size.

Although certain embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A printed circuit board assembly comprising:

a printed circuit board;

a connector mounted on the printed circuit board, the connector including at least one terminal electrically connected to an external device, wherein a first portion of the at least one terminal contacts the printed circuit board and a second portion of the at least one terminal contacts the connector, wherein a width of the first portion is larger than a width of the second portion; and at least one electronic component mounted on the printed circuit board and electrically connected to the at least one terminal of the connector, wherein the connector comprises at least one test point electrically connected to the at least one terminal, the at least one test point configured to make contact with a test probe on the first portion of an upper surface of the at least one terminal and including a recess into which a test probe is inserted.

2. The printed circuit board assembly of claim 1, wherein the at least one terminal is disposed on an upper surface of the printed circuit board such that at least a portion of a surface of the at least one terminal is exposed.

3. The printed circuit board assembly of claim 2, wherein the at least one test point is disposed on the at least a portion of the surface of the at least one terminal.

4. The printed circuit board assembly of claim 1, wherein the connector includes a plurality of terminals and the plurality of terminals are arranged to be spaced apart from each other by a predetermined distance.

5. The printed circuit board assembly of claim 4, wherein the connector comprises a plurality of test points and the plurality of test points are respectively electrically connected to the plurality of terminals and wherein the plurality of test points are configured to make contact with the test probe.

6. The printed circuit board assembly of claim 1, wherein the connector further comprises a contact portion connected to one end of the at least one terminal, and the at least one test point is disposed on an upper portion of the contact portion.

7. The printed circuit board assembly of claim 1, wherein the connector comprises a slot into which a contact pad of the external device is inserted.

8. The printed circuit board assembly of claim 7, wherein the contact pad is electrically connected to the at least one terminal when the contact pad of the external device is inserted into the slot.

9. The printed circuit board assembly of claim 1, wherein the electronic component comprises a light emitting diode package.

10. A display device comprising:

a display panel;

a driving circuit configured to generate driving signals to drive the display panel; and a backlight assembly configured to provide a light to the display panel, the backlight assembly comprising:

a printed circuit board;

a connector including at least one terminal mounted on the printed circuit board and electrically connected to the driving circuit, wherein a first portion of the at least one terminal contacts the printed circuit board and a second portion of the at least one terminal contacts the connector, wherein a width of the first portion is larger than a width of the second portion; and at least one light emitting diode package mounted on the printed circuit board and electrically connected to the at least one terminal of the connector, wherein the connector comprises at least one test point electrically connected to the at least one terminal, configured to make contact with a test probe on the first portion of an upper surface of the at least one terminal, and including a recess into which the test probe is inserted.

11. The display device of claim 10, wherein the at least one terminal is disposed on an upper surface of the printed circuit board such that at least a portion of a surface of the at least one terminal is exposed.

12. The display device of claim 11, wherein the at least one test point is disposed on the at least a portion of the surface of the at least one terminal.

13. The display device of claim 10, wherein the connector further comprises a contact portion connected to one end of the at least one terminal, and the at least one test point is disposed on an upper portion of the contact portion to make contact with the test probe.

14. The display device of claim 13, wherein the connector comprises a slot into which a contact pad of the driving circuit is inserted.

15. The display device of claim 14, wherein the contact pad is electrically connected to the at least one terminal when the contact pad of the driving circuit is inserted into the slot.

* * * * *